United States Patent [19]
Sonobe

[11] Patent Number: 4,618,209
[45] Date of Patent: Oct. 21, 1986

[54] LEAD MEMBER AND METHOD OF FIXING THEREOF

[75] Inventor: Toshimitsu Sonobe, Tokyo, Japan

[73] Assignee: Thomas & Betts Corporation, Raritan, N.J.

[21] Appl. No.: 662,854

[22] Filed: Oct. 19, 1984

[51] Int. Cl.$^4$ ............................................. H01R 13/10
[52] U.S. Cl. ............................ 339/258 R; 339/17 C; 339/275 B; 339/276 SF
[58] Field of Search ............ 339/17 C, 258 R, 258 P, 339/275 B, 276 SF

[56] References Cited

U.S. PATENT DOCUMENTS

| | | | |
|---|---|---|---|
| 3,731,259 | 5/1973 | Occhipinti | 339/66 |
| 3,750,252 | 8/1973 | Landman | 339/275 B |
| 3,786,402 | 1/1974 | Horecky | 339/276 A |
| 3,905,665 | 9/1975 | Lynch et al. | 339/17 L |
| 3,993,383 | 1/1976 | Marino | 339/17 |
| 4,232,931 | 11/1980 | Takeuchi et al. | 339/258 R |
| 4,257,668 | 3/1981 | Ellis, Jr. | 339/275 B |
| 4,384,757 | 5/1983 | Andrews, Jr. et al. | 339/258 R |
| 4,428,642 | 1/1984 | Schwindt et al. | 339/276 SF |

Primary Examiner—Joseph H. McGlynn
Attorney, Agent, or Firm—Robert M. Rodrick; Salvatore J. Abbruzzese

[57] ABSTRACT

A lead member comprises a plurality of leg pieces, an interlink plate for holding the leg pieces spaced from each other at predetermined intervals to thereby interlink respective one ends of the leg pieces. Terminal portions are provided at the respective other ends of the leg pieces to attach to a PCB, a wire or the like. Each of the leg pieces is folded to overlap the interlink plate so as to form a leg portion at the folded section, the leg portion being insertable into predetermined openings in another PCB or substrate.

10 Claims, 11 Drawing Figures

FIG. 1a  FIG. 1b
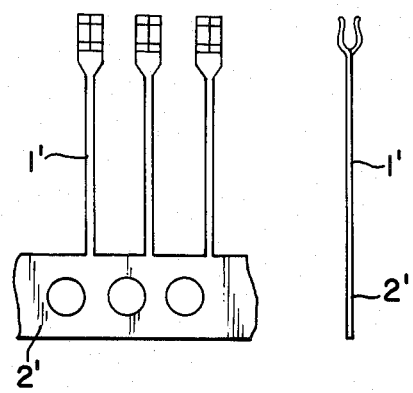
FIG. 2a  FIG. 2b
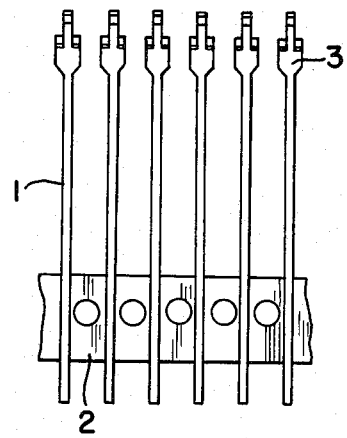 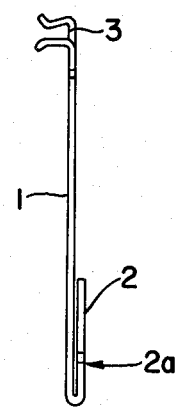

LEAD MEMBER AND METHOD OF FIXING THEREOF

BACKGROUND OF THE INVENTION

The present invention relates to an electrical lead member for connection to an indicator panel, a printed circuit board (PCB), a wire or the like, and more particularly to a lead member which enables each lead to be easily inserted into a respective opening, for example, on the PCB when the lead member is connected to such PCB.

DESCRIPTION OF THE PRIOR ART

In FIGS. 1a and 1b, there is shown a conventional lead member which is well known in the electrical connection art. The lead member is to be connected to an indicator panel (not shown) or the like at one end. An interlink plate (carrier) 2' disposed at the other end of the lead member is cut off before insertion of the leads into the PCB, and then each lead is inserted into a predetermined opening on the PCB, respectively.

The leg pieces 1' on leads tend to be out of line during insertion, making it difficult for assemblers to keep the leads in alignment. Such insertion is accordingly not conducted easily by hand and therefore, special tooling is often employed for keeping the leg pieces or leads in alignment during assembly. It is thereby desirable to have a lead member structure that can be maintained in alignment for insertion into a PCB and which facilitates assembly.

SUMMARY OF THE INVENTION

In view of the above-mentioned circumstances, the present invention has been developed. The present invention includes an interlink plate that maintains leg pieces or leads in alignment in addition to interconnecting the leg pieces with each other. The lead member comprises folded leg pieces that form a leg portion, the leg portion adapted to be inserted into holes in a PCB. Thereafter, the leg portions are broken off when the lead member is secured to the PCB.

BRIEF DESCRIPTION OF THE DRAWINGS

The invention will hereinafter be described in detail with respect to embodiments thereof shown in the accompanying drawings.

FIG. 1a is an elevational view of a lead member according to a prior art technology.

FIG. 1b is a side view of the lead member shown in FIG. 1a.

FIG. 2a is an elevational view of a first embodiment of the present invention.

FIG. 2b is a side view of the first embodiment shown in FIG. 2a.

DESCRIPTION OF THE PREFERRED EMBODIMENTS

Figure 3:
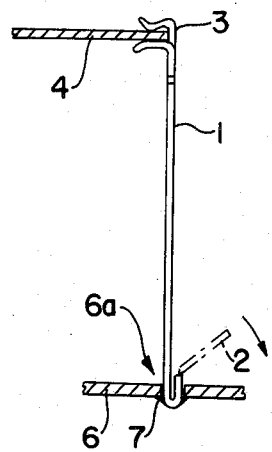
FIG. 3 is a sectional side view of a lead member shown in FIGS. 2a and 2b, the lead member being attached to a PCB.

Referring to FIGS. 2 and 3 which show a first embodiment of the present invention, a lead member comprises a plurality of leg pieces 1 and an interlink plate 2 for holding said leg pieces spaced away from each other at predetermined intervals to interlink one of the ends of the leg pieces. Terminal portions 3 are provided at the respective other ends of said leg pieces to attach or secure the leg pieces to a PCB, a panel, a wire or the like thereto, said leg pieces being folded over to overlap the interlink plate so as to form a leg portion at the folded section.

Figure 4:
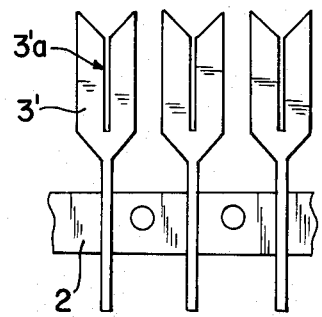
FIG. 4 is an elevational view of a second embodiment of the present invention.
Figure 5:
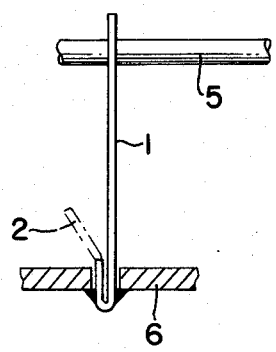
FIG. 5 is a sectional side view of a lead member shown in FIG. 4, the lead member being attached to a PCB.

The portions 3 are formed as clips, each having a U-shaped cross-section, and are adapted as shown in FIG. 3 to attach to an indicator panel 4, a PCB or the like thereto. Thus, each leg piece serves as an electrode of the indicator panel or the like. The shapes of the portions 3 are not limited to that just described, but can be arranged to suit the particular application. For example, the portions 3 may be formed as terminals being capable of crimping together with a wire or the like such as a ribbon wire or a discrete wire. Also, as shown in FIG. 4, the portions 3 may be formed as terminals 3' having slits 3a' for piercing a wire 5 as shown in FIGS. 4 and 5. In this arrangement, a wire 5 as depicted in FIG. 5 will be inserted into the slit 3a' so that the insulative material will be pierced by the edges of the slit. As a result, a core wire comes into contact with each terminal so as to provide electrical connection thereto.

Figure 6:
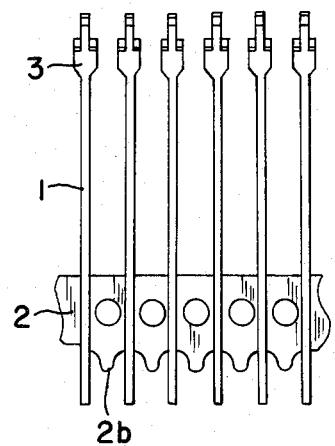
FIG. 6 is an elevational view of a third embodiment of the present invention.

In another embodiment shown in FIG. 6 there is provided a downward projection 2b on at least one of portions of the interlink plate 2 located between said leg pieces. The projection 2b enables the interlink plate to be spaced away from the PCB when the leg portion 1 is inserted into the holes on the PCB. Thus, it prevents the interlink plate from being inadvertently soldered together with the leg portion by solder flowing out through a gap between each hole of the PCB and the leg portion during the soldering process.

Figure 7:
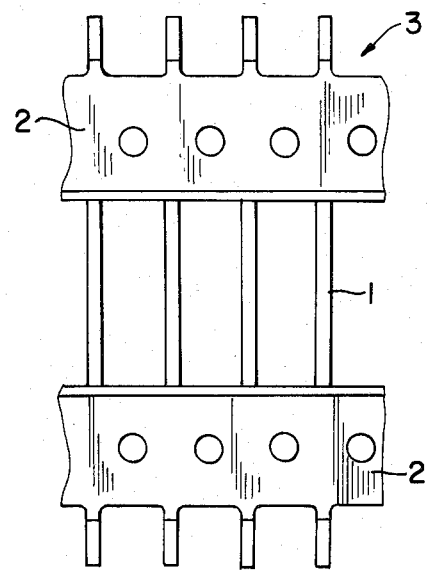
FIG. 7 is an elevational view of a fourth embodiment of the present invention.
Figure 8:
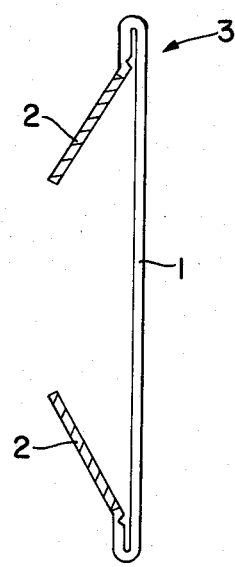
FIG. 8 is a sectional side view of the fourth embodiment.
Figure 9:
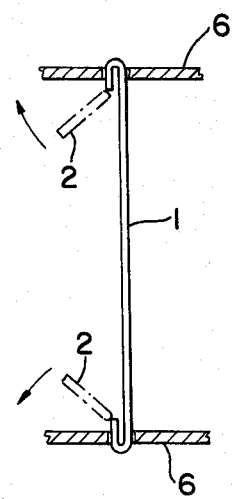
FIG. 9 is a sectional side view of a lead member shown in FIGS. 7 and 8, the lead member being attached to a PCB.

Furthermore, as shown in FIGS. 7 to 9, the portions 3 may be formed as terminals having the same leg portion as formed at the other ends of the leg pieces folded to overlap the interlink plate.

Procedures for attaching the lead member to a PCB 6 will now be described more fully. After the terminal portion 3 of the lead member is connected to a panel, a PCB, a wire or the like, the leg portion of the lead member is inserted as shown in FIG. 3 into predetermined openings 6a on the PCB 6 to be secured by solder 7 thereon. Alternatively, the panel or the like may be attached to the terminal portion 3 after the leg portion is secured to the PCB. Then, the interlink plate 2 is separated therefrom, e.g., by being broken off from the leg portion as shown in FIG. 3. The soldering process may be conducted after this separation.

To facilitate breaking off of the interlink plate, notches 2a (FIG. 2b) are provided at the connecting portions between the interlink plate and the leg portion. In actual applications, locations of the interlink plate and notches will vary depending on thickness of the PCB.

The above-described embodiments refer to the lead member as inserted into openings of a PCB. However, the lead member of the present invention has various other applications or use. For example, in another application, the folded leg portion may be attached to sections of a copper film which are arranged on a PCB at predetermined intervals, and thereafter the interlink plate may be broken off from the leg portion. In a further application, the lead member may be inserted into a plastic member or the like, and thereafter the interlink plate broken off from the leg portion. In the latter application, said plastic member serves as a holding member for holding the leg pieces and the leg portion projecting out from the plastic member is readily inserted into holes on a PCB.

The lead member of the present invention as described in detail herein provides the following distinctive effects.

The lead member of the present invention maintains the leg portion in alignment as the lead member is constructed such that leg pieces including the interlink plate are folded, the folded portion being insertable into openings of a PCB while the interlink plate remains on the lead member during insertion. Thereafter, the leg portion may be easily set in its appropriate position for insertion into repective openings without difficulty, thereby improving the efficiency of assembly. In addition, the material for the lead member is not restricted.

While there has been shown and described herein the preferred embodiments of the present invention, various changes and modifications may be made with respect thereto without departing from the scope of the invention as set forth in the following claims.

I claim:

1. A lead member comprising:
   plural leg pieces;
   a removable interlink plate for holding said leg pieces spaced at a predetermined distance to interlink respective one ends of the leg pieces; and
   terminal portions provided at the respective other ends of said leg pieces to attach to a PCB, a wire or the like;
   each of said leg pieces being folded to overlap said interlink plate forming thereby a leg portion at the folded section, said leg portions defining a plurality of insertion ends arranged for secured insertion into openings of a PCB or the like while said interlink plate remains attached to said leg pieces.

2. A lead member according to claim 1, wherein said terminal portion is a clip for holding a plate.

3. A lead member according to claim 1, wherein said terminal portion is a crimping terminal.

4. A lead member according to claim 1, wherein said terminal portion is a piercing terminal.

5. A lead member according to claim 1, wherein said terminal portion is a leg portion formed by folding each of said leg pieces to overlap an interlink plate provided at the other ends of said leg pieces.

6. A lead member according to claim 1, wherein a notch is provided between said interlink plate and each of said leg pieces.

7. A lead member according to claim 1, wherein a downward projection is provided in at least one of the portions of said interlink plate located between said leg pieces.

8. A method of attaching a lead member to a PCB or the like comprising the steps of:
   attaching to such PCB leg portions of a lead member which comprises plural leg pieces, an interlink plate holding said leg pieces spaced at a predetermined distance and interlinking respective ends of the leg pieces and terminal portions provided at the respective other ends of said leg pieces to attach to another PCB, a wire or the like thereto, each of said leg pieces being folded to overlap said interlink plate forming thereby said leg portions at the folded sections, and then
   separating said interlink plate from said leg pieces.

9. A method according to claim 8, wherein said attaching step is practiced by inserting said leg portion into predetermined apertures of the PCB.

10. A method according to claim 9, wherein said attaching step is practiced by securing said leg portions by soldering.

* * * * *